(12) United States Patent
Cady et al.

(10) Patent No.: US 7,606,050 B2
(45) Date of Patent: Oct. 20, 2009

(54) COMPACT MODULE SYSTEM AND METHOD

(75) Inventors: James W. Cady, Austin, TX (US); James Douglas Wehrly, Jr., Austin, TX (US); Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 67 days.

(21) Appl. No.: 11/187,269

(22) Filed: Jul. 22, 2005

(65) Prior Publication Data

US 2006/0050592 A1 Mar. 9, 2006

Related U.S. Application Data

(63) Continuation-in-part of application No. 11/123,721, filed on May 6, 2005, which is a continuation-in-part of application No. 11/068,688, filed on Mar. 1, 2005, now Pat. No. 7,324,352, which is a continuation-in-part of application No. 11/007,551, filed on Dec. 8, 2004, now Pat. No. 7,511,968, which is a continuation-in-part of application No. 10/934,027, filed on Sep. 3, 2004.

(51) Int. Cl.
*H05K 7/00* (2006.01)
(52) U.S. Cl. .................. 361/783; 361/730; 174/254
(58) Field of Classification Search .......... 361/783, 361/730; 174/254
See application file for complete search history.

(56) References Cited

U.S. PATENT DOCUMENTS

| | | |
|---|---|---|
| 3,372,310 A | 3/1968 | Kantor |
| 3,436,604 A | 4/1969 | Hyltin |
| 3,582,865 A | 6/1971 | Franck et al. |
| 3,654,394 A | 4/1972 | Gordon |

(Continued)

FOREIGN PATENT DOCUMENTS

EP 122-687 A 10/1984

(Continued)

OTHER PUBLICATIONS

PCT/US2006/007193, International Search Report and Written Opinion of the International Searching Authority,, PCT, Nov. 7, 2007.

(Continued)

*Primary Examiner*—Ishwar I. B. Patel
(74) *Attorney, Agent, or Firm*—Fish & Richardson P.C.

(57) ABSTRACT

A flexible circuit is populated on one or both sides and disposed about a substrate to create a circuit module. Along one of its edges, the flex circuit is connected to a connective facility such as a multiple pin connector while the flex circuit is disposed about a thermally-conductive form that provides structure to create a module with plural layers of circuitry in a single module. In preferred embodiments, the form is metallic and, in alternative preferred embodiments, the module circuitry is disposed within a housing. Preferred embodiments may be devised that present a compact flash module within a housing that may be connected to or into a system or product through a connective facility that is preferably a male or female socket connector while the housing is configured to mechanically adapt to an application environment.

13 Claims, 11 Drawing Sheets

U.S. PATENT DOCUMENTS

| | | | |
|---|---|---|---|
| 3,704,455 A | 11/1972 | Scarbrough | |
| 3,718,842 A | 2/1973 | Abbott, III, et al. | |
| 3,727,064 A | 4/1973 | Bottini | |
| 3,746,934 A | 7/1973 | Stein | |
| 3,766,439 A * | 10/1973 | Isaacson | 361/714 |
| 3,772,776 A | 11/1973 | Weisenburger | |
| 3,873,889 A * | 3/1975 | Leyba | 361/728 |
| 4,169,642 A | 10/1979 | Mouissie | |
| 4,288,841 A | 9/1981 | Gogal | |
| 4,342,069 A | 7/1982 | Link | |
| 4,429,349 A | 1/1984 | Zachry | |
| 4,437,235 A | 3/1984 | McIver | |
| 4,513,368 A | 4/1985 | Houseman | |
| 4,547,834 A | 10/1985 | Dumont et al. | |
| 4,567,543 A | 1/1986 | Miniet | |
| 4,587,596 A | 5/1986 | Bunnell | |
| 4,645,944 A | 2/1987 | Uya | |
| 4,656,605 A | 4/1987 | Clayton | |
| 4,672,421 A | 6/1987 | Lin | |
| 4,682,207 A | 7/1987 | Akasaki et al. | |
| 4,696,525 A | 9/1987 | Coller et al. | |
| 4,709,300 A | 11/1987 | Landis | |
| 4,724,611 A | 2/1988 | Hagihara | |
| 4,727,513 A | 2/1988 | Clayton | |
| 4,733,461 A | 3/1988 | Nakano | |
| 4,739,589 A | 4/1988 | Brehm et al. | |
| 4,763,188 A | 8/1988 | Johnson | |
| 4,771,366 A | 9/1988 | Blake et al. | |
| 4,821,007 A | 4/1989 | Fields et al. | |
| 4,823,234 A | 4/1989 | Konishi et al. | |
| 4,833,568 A | 5/1989 | Berhold | |
| 4,850,892 A | 7/1989 | Clayton et al. | |
| 4,862,249 A | 8/1989 | Carlson | |
| 4,911,643 A | 3/1990 | Perry et al. | |
| 4,953,060 A | 8/1990 | Lauffer et al. | |
| 4,956,694 A | 9/1990 | Eide | |
| 4,972,580 A | 11/1990 | Nakamura | |
| 4,982,265 A | 1/1991 | Watanabe et al. | |
| 4,983,533 A | 1/1991 | Go | |
| 4,985,703 A | 1/1991 | Kaneyama | |
| 4,992,849 A | 2/1991 | Corbett et al. | |
| 4,992,850 A | 2/1991 | Corbett et al. | |
| 5,014,115 A | 5/1991 | Moser | |
| 5,014,161 A | 5/1991 | Lee et al. | |
| 5,016,138 A | 5/1991 | Woodman | |
| 5,025,306 A | 6/1991 | Johnson et al. | |
| 5,034,350 A | 7/1991 | Marchisi | |
| 5,041,015 A | 8/1991 | Travis | |
| 5,053,853 A | 10/1991 | Haj-Ali-Ahmadi et al. | |
| 5,065,277 A | 11/1991 | Davidson | |
| 5,099,393 A | 3/1992 | Bentlage et al. | |
| 5,104,820 A | 4/1992 | Go et al. | |
| 5,109,318 A | 4/1992 | Funari et al. | |
| 5,117,282 A | 5/1992 | Salatino | |
| 5,119,269 A | 6/1992 | Nakayama | |
| 5,138,430 A | 8/1992 | Gow, III, et al. | |
| 5,138,434 A | 8/1992 | Wood et al. | |
| 5,140,405 A | 8/1992 | King et al. | |
| 5,159,535 A | 10/1992 | Desai et al. | |
| 5,173,840 A | 12/1992 | Kodai et al. | |
| 5,191,404 A | 3/1993 | Wu et al. | |
| 5,208,729 A | 5/1993 | Cipolla et al. | |
| 5,214,845 A | 6/1993 | King et al. | |
| 5,219,377 A | 6/1993 | Poradish | |
| 5,222,014 A | 6/1993 | Lin | |
| 5,224,023 A | 6/1993 | Smith et al. | |
| 5,229,916 A | 7/1993 | Frankeny et al. | |
| 5,229,917 A | 7/1993 | Harris et al. | |
| 5,239,198 A | 8/1993 | Lin et al. | |
| 5,241,454 A | 8/1993 | Ameen et al. | |
| 5,241,456 A | 8/1993 | Marcinkiewicz et al. | |
| 5,247,423 A | 9/1993 | Lin et al. | |
| 5,252,857 A | 10/1993 | Kane et al. | |
| 5,259,770 A | 11/1993 | Bates et al. | |
| 5,261,068 A | 11/1993 | Gaskins et al. | |
| 5,268,815 A | 12/1993 | Cipolla et al. | |
| 5,276,418 A | 1/1994 | Klosowiak et al. | |
| 5,281,852 A | 1/1994 | Normington | |
| 5,285,398 A * | 2/1994 | Janik | 361/683 |
| 5,289,062 A | 2/1994 | Wyland | |
| 5,309,986 A | 5/1994 | Itoh | |
| 5,313,097 A | 5/1994 | Haj-Ali-Ahmadi et al. | |
| 5,347,428 A | 9/1994 | Carson et al. | |
| 5,362,656 A * | 11/1994 | McMahon | 29/827 |
| 5,375,041 A | 12/1994 | McMahon | |
| 5,386,341 A | 1/1995 | Olson et al. | |
| 5,394,300 A | 2/1995 | Yoshimura | |
| 5,397,916 A | 3/1995 | Normington | |
| 5,400,003 A | 3/1995 | Kledzik | |
| 5,428,190 A | 6/1995 | Stopperan | |
| 5,438,224 A | 8/1995 | Papageorge et al. | |
| 5,448,511 A | 9/1995 | Paurus et al. | |
| 5,477,082 A | 12/1995 | Buckley, III et al. | |
| 5,491,612 A | 2/1996 | Nicewarner, Jr. et al. | |
| 5,502,333 A | 3/1996 | Bertin et al. | |
| 5,523,619 A | 6/1996 | McAllister et al. | |
| 5,523,695 A | 6/1996 | Lin | |
| 5,541,812 A | 7/1996 | Burns | |
| 5,572,065 A | 11/1996 | Burns | |
| 5,600,178 A | 2/1997 | Russell | |
| 5,612,570 A | 3/1997 | Eide et al. | |
| 5,631,193 A | 5/1997 | Burns | |
| 5,642,055 A | 6/1997 | Difrancesco | |
| 5,644,161 A | 7/1997 | Burns | |
| 5,646,446 A * | 7/1997 | Nicewarner et al. | 257/723 |
| 5,654,877 A | 8/1997 | Burns | |
| 5,661,339 A | 8/1997 | Clayton | |
| 5,686,730 A | 11/1997 | Laudon et al. | |
| 5,688,606 A * | 11/1997 | Mahulikar et al. | 428/615 |
| 5,708,297 A | 1/1998 | Clayton | |
| 5,714,802 A | 2/1998 | Cloud et al. | |
| 5,717,556 A | 2/1998 | Yanagida | |
| 5,729,894 A | 3/1998 | Rostoker et al. | |
| 5,731,633 A | 3/1998 | Clayton | |
| 5,744,862 A | 4/1998 | Ishii | |
| 5,751,553 A | 5/1998 | Clayton | |
| 5,754,409 A * | 5/1998 | Smith | 361/803 |
| 5,764,497 A | 6/1998 | Mizumo | |
| 5,776,797 A | 7/1998 | Nicewarner, Jr. et al. | |
| 5,789,815 A * | 8/1998 | Tessier et al. | 257/723 |
| 5,790,447 A | 8/1998 | Laudon et al. | |
| 5,802,395 A | 9/1998 | Connolly et al. | |
| 5,805,422 A | 9/1998 | Otake et al. | |
| 5,828,125 A | 10/1998 | Burns | |
| 5,835,988 A | 11/1998 | Ishii | |
| 5,869,353 A | 2/1999 | Levy et al. | |
| 5,899,705 A | 5/1999 | Akram | |
| 5,917,709 A | 6/1999 | Johnson et al. | |
| 5,925,934 A | 7/1999 | Lim | |
| 5,926,369 A * | 7/1999 | Ingraham et al. | 361/699 |
| 5,949,657 A | 9/1999 | Karabatsos | |
| 5,953,214 A | 9/1999 | Dranchak et al. | |
| 5,953,215 A | 9/1999 | Karabatsos | |
| 5,959,839 A | 9/1999 | Gates | |
| 5,963,427 A | 10/1999 | Bolleson | |
| 5,969,945 A * | 10/1999 | Cutting et al. | 361/704 |
| 5,973,395 A | 10/1999 | Suzuki et al. | |
| 5,995,370 A | 11/1999 | Nakamori | |
| 6,002,167 A | 12/1999 | Hatano et al. | |
| 6,002,589 A | 12/1999 | Perino et al. | |
| 6,008,538 A | 12/1999 | Akram et al. | |
| 6,014,316 A | 1/2000 | Eide | |
| 6,021,048 A | 2/2000 | Smith | |
| 6,025,992 A * | 2/2000 | Dodge et al. | 361/704 |

| | | | | | | |
|---|---|---|---|---|---|---|
| 6,028,352 A | 2/2000 | Eide | | 6,502,161 B1 | 12/2002 | Perego et al. |
| 6,028,365 A | 2/2000 | Akram et al. | | 6,514,793 B2 | 2/2003 | Isaak |
| 6,034,878 A | 3/2000 | Osaka et al. | | 6,521,984 B2 | 2/2003 | Matsuura |
| 6,038,132 A | 3/2000 | Tokunaga et al. | | 6,528,870 B2 | 3/2003 | Fukatsu et al. |
| 6,040,624 A | 3/2000 | Chambers et al. | | 6,531,772 B2 | 3/2003 | Akram et al. |
| 6,049,975 A | 4/2000 | Clayton | | 6,544,815 B2 | 4/2003 | Isaak |
| 6,060,339 A | 5/2000 | Akram et al. | | 6,552,910 B1 | 4/2003 | Moon et al. |
| 6,072,233 A | 6/2000 | Corisis et al. | | 6,552,948 B2 | 4/2003 | Woo et al. |
| 6,078,515 A | 6/2000 | Nielsen et al. | | 6,560,117 B2 | 5/2003 | Moon |
| 6,084,294 A | 7/2000 | Tomita | | 6,566,746 B2 | 5/2003 | Isaak et al. |
| 6,091,145 A * | 7/2000 | Clayton ............ 257/724 | | 6,572,387 B2 | 6/2003 | Burns et al. |
| 6,097,087 A | 8/2000 | Farnworth et al. | | 6,573,593 B1 | 6/2003 | Syri et al. |
| 6,111,757 A | 8/2000 | Dell et al. | | 6,576,992 B1 | 6/2003 | Cady et al. |
| 6,121,676 A | 9/2000 | Solberg | | 6,588,095 B2 | 7/2003 | Pan |
| RE36,916 E | 10/2000 | Moshayedi | | 6,590,282 B1 * | 7/2003 | Wang et al. ............ 257/686 |
| 6,157,541 A | 12/2000 | Hacke | | 6,600,222 B1 | 7/2003 | Levardo |
| 6,172,874 B1 | 1/2001 | Bartilson | | 6,614,664 B2 | 9/2003 | Lee |
| 6,178,093 B1 | 1/2001 | Bhatt et al. | | 6,627,984 B2 | 9/2003 | Bruce et al. |
| 6,180,881 B1 | 1/2001 | Isaak | | 6,629,855 B1 | 10/2003 | North et al. |
| 6,187,652 B1 | 2/2001 | Chou et al. | | 6,646,936 B2 | 11/2003 | Hamamatsu et al. |
| 6,205,654 B1 | 3/2001 | Burns | | 6,660,561 B2 | 12/2003 | Forthun |
| 6,208,521 B1 | 3/2001 | Nakatsuka | | 6,661,092 B2 | 12/2003 | Shibata et al. |
| 6,208,546 B1 | 3/2001 | Ikeda | | 6,677,670 B2 | 1/2004 | Kondo |
| 6,214,641 B1 | 4/2001 | Akram | | 6,683,377 B1 | 1/2004 | Shim et al. |
| 6,215,181 B1 | 4/2001 | Akram et al. | | 6,690,584 B2 | 2/2004 | Uzuka et al. |
| 6,215,687 B1 | 4/2001 | Sugano et al. | | 6,699,730 B2 | 3/2004 | Kim et al. |
| 6,222,737 B1 | 4/2001 | Ross | | 6,720,652 B2 | 4/2004 | Akram et al. |
| 6,222,739 B1 | 4/2001 | Bhakta et al. | | 6,721,181 B1 | 4/2004 | Pfeifer et al. |
| 6,225,688 B1 | 5/2001 | Kim et al. | | 6,721,185 B2 | 4/2004 | Dong et al. |
| 6,232,659 B1 | 5/2001 | Clayton | | 6,721,226 B2 | 4/2004 | Woo et al. |
| 6,233,650 B1 | 5/2001 | Johnson et al. | | 6,744,656 B2 | 6/2004 | Sugano et al. |
| 6,234,820 B1 | 5/2001 | Perino et al. | | 6,751,113 B2 | 6/2004 | Bhakta et al. |
| 6,262,476 B1 | 7/2001 | Vidal | | 6,756,661 B2 | 6/2004 | Tsuneda et al. |
| 6,262,895 B1 | 7/2001 | Forthun | | 6,760,220 B2 | 7/2004 | Canter et al. |
| 6,265,660 B1 | 7/2001 | Tandy | | 6,762,942 B1 | 7/2004 | Smith |
| 6,266,252 B1 | 7/2001 | Karabatsos | | 6,768,660 B2 | 7/2004 | Kong et al. |
| 6,281,577 B1 | 8/2001 | Oppermann et al. | | 6,833,981 B2 | 12/2004 | Suwabe et al. |
| 6,288,907 B1 | 9/2001 | Burns | | 6,833,984 B1 | 12/2004 | Belgacem |
| 6,288,924 B1 | 9/2001 | Sugano et al. | | 6,839,266 B1 | 1/2005 | Garrett, Jr. et al. |
| 6,300,679 B1 | 10/2001 | Mukerji et al. | | 6,841,868 B2 | 1/2005 | Akram et al. |
| 6,316,825 B1 | 11/2001 | Park et al. | | 6,850,414 B2 | 2/2005 | Benisek et al. |
| 6,323,060 B1 | 11/2001 | Isaak | | 6,873,534 B2 | 3/2005 | Bhakta et al. |
| 6,336,262 B1 | 1/2002 | Dalal et al. | | 6,878,571 B2 | 4/2005 | Isaak et al. |
| 6,343,020 B1 | 1/2002 | Lin et al. | | 6,884,653 B2 | 4/2005 | Larson |
| 6,347,394 B1 | 2/2002 | Ochoa et al. | | 6,914,324 B2 | 7/2005 | Rapport et al. |
| 6,349,050 B1 | 2/2002 | Woo et al. | | 6,919,626 B2 | 7/2005 | Burns |
| 6,351,029 B1 | 2/2002 | Isaak | | 6,956,284 B2 | 10/2005 | Cady et al. |
| 6,357,023 B1 | 3/2002 | Co et al. | | 6,975,034 B2 * | 12/2005 | Hennig et al. ............ 257/762 |
| 6,358,772 B2 | 3/2002 | Miyoshi | | 7,053,478 B2 | 5/2006 | Roper et al. |
| 6,360,433 B1 | 3/2002 | Ross | | 7,094,632 B2 | 8/2006 | Cady et al. |
| 6,368,896 B2 | 4/2002 | Farnworth et al. | | 7,180,167 B2 | 2/2007 | Partridge et al. |
| 6,370,668 B1 | 4/2002 | Garrett, Jr. et al. | | 2001/0001085 A1 | 5/2001 | Hassanzadeh et al. |
| 6,376,769 B1 | 4/2002 | Chung | | 2001/0006252 A1 | 7/2001 | Kim et al. |
| 6,392,162 B1 | 5/2002 | Karabatsos | | 2001/0013423 A1 | 8/2001 | Dalal et al. |
| 6,404,043 B1 | 6/2002 | Isaak | | 2001/0015487 A1 | 8/2001 | Forthun |
| 6,410,857 B1 | 6/2002 | Gonya | | 2001/0026009 A1 | 10/2001 | Tsuneda et al. |
| 6,426,240 B2 | 7/2002 | Isaak | | 2001/0028588 A1 | 10/2001 | Yamada et al. |
| 6,426,549 B1 | 7/2002 | Isaak | | 2001/0035572 A1 | 11/2001 | Isaak |
| 6,426,560 B1 | 7/2002 | Kawamura et al. | | 2001/0040793 A1 | 11/2001 | Inaba |
| 6,428,360 B2 | 8/2002 | Hassanzadeh et al. | | 2001/0052637 A1 | 12/2001 | Akram et al. |
| 6,433,418 B1 | 8/2002 | Fujisawa et al. | | 2002/0001216 A1 | 1/2002 | Sugano et al. |
| 6,444,921 B1 | 9/2002 | Wang et al. | | 2002/0006032 A1 | 1/2002 | Karabatsos |
| 6,446,158 B1 | 9/2002 | Karabatsos | | 2002/0030995 A1 | 3/2002 | Shoji |
| 6,449,159 B1 | 9/2002 | Haba | | 2002/0076919 A1 | 6/2002 | Peters et al. |
| 6,452,826 B1 | 9/2002 | Kim et al. | | 2002/0094603 A1 | 7/2002 | Isaak |
| 6,459,152 B1 | 10/2002 | Tomita et al. | | 2002/0101261 A1 | 8/2002 | Karabatsos |
| 6,462,412 B2 | 10/2002 | Kamei et al. | | 2002/0139577 A1 | 10/2002 | Miller |
| 6,465,877 B1 | 10/2002 | Farnworth et al. | | 2002/0164838 A1 | 11/2002 | Moon et al. |
| 6,465,893 B1 | 10/2002 | Khandros et al. | | 2002/0180022 A1 | 12/2002 | Emoto |
| 6,472,735 B2 | 10/2002 | Isaak | | 2002/0185731 A1 | 12/2002 | Akram et al. |
| 6,473,308 B2 | 10/2002 | Forthun | | 2002/0196612 A1 | 12/2002 | Gall et al. |
| 6,486,544 B1 | 11/2002 | Hashimoto | | 2003/0002262 A1 | 1/2003 | Benisek et al. |
| 6,489,687 B1 | 12/2002 | Hashimoto | | 2003/0026155 A1 | 2/2003 | Yamagata |

| | | | |
|---|---|---|---|
| 2003/0035328 A1 | 2/2003 | Hamamatsu et al. | |
| 2003/0045025 A1 | 3/2003 | Coyle et al. | |
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1 | 6/2003 | Miyamoto et al. | |
| 2003/0159278 A1 | 8/2003 | Peddle | |
| 2003/0168725 A1 | 9/2003 | Warner et al. | |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0049513 A1 | 3/2006 | Goodwin | |
| 2006/0050489 A1 | 3/2006 | Wehrly, Jr. et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2007/0115017 A1 | 5/2007 | Goodwin | |
| 2008/0030966 A1 | 2/2008 | Goodwin | |
| 2008/0030972 A1 | 2/2008 | Goodwin | |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335695 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/009231 A | 1/2002 |
| JP | 2003/1037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report. PCT, Feb. 16, 2007.
PCT/US06/38720 International Search Report and Written Opinion, PCT, Apr. 5, 2007.

* cited by examiner

COMPACT MODULE SYSTEM AND METHOD

RELATED APPLICATIONS

The present application is a continuation-in-part of U.S. patent application Ser. No. 11/123,721, filed May 6, 2005 which is, in turn, a continuation-in-part of U.S. patent application Ser. No. 11/068,688, filed Mar. 1, 2005 now U.S. Pat. No. 7,324,352 which is a continuation-in-part of U.S. patent application Ser. No. 11/007,551, filed Dec. 8, 2004 now U.S. Pat. No. 7,511,968 which application is a continuation-in-part of U.S. patent application Ser. No. 10/934,027, filed Sep. 3, 2004. U.S. patent application Ser. No. 11/123,721, U.S. patent application Ser. No. 11/068,688, U.S. patent application Ser. No. 11/007,551, and U.S. patent application Ser. No. 10/934,027 are each incorporated by reference herein.

FIELD

The present invention relates to systems and methods for creating high density circuit modules and, in particular, systems and methods related to flash memory modules.

BACKGROUND

A variety of techniques are used to make high density circuit modules. Memory expansion is one of the many fields in which high density circuit board solutions provide space-saving advantages. For example, the well-known DIMM (Dual In-line Memory Module) board has been used for years, in various forms, to provide memory expansion. A typical DIMM includes a conventional PCB (Printed Circuit Board) with DRAM memory devices and supporting digital logic.

Strategies used to devise and/or increase the capacity of DRAM-mounted DIMMs may be applicable to other memory modules such as, for example, memory modules that employ flash memory storage or added memory for video processing. The module is typically mounted in the host computer system by inserting a contact-bearing edge of the module into a card edge connector. Typically, systems that employ memory modules provide limited space for such devices and most memory expansion boards are somewhat limited in the memory capacity they add to a system. There are several known methods to improve the limited capacity of a memory module. Such methods have various cost or performance impacts. Further, many capacity increasing techniques exacerbate profile issues and contribute to thermal management complexities.

One scheme to increase circuit board capacity is multiple die packages (MDP). This scheme increases the capacity of the memory devices on the module by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

In yet another strategy, stacked packages are employed to increase module capacity. This scheme increases capacity by stacking packaged integrated circuits to, create a high-density circuit module. In some techniques, flexible conductors are used to selectively interconnect packaged integrated circuits. Staktek Group L.P. has developed numerous systems for aggregating leaded or CSP (chipscale packaged) devices in space saving topologies. The increased component height of some stacking techniques may alter, however, system requirements such as, for example, required cooling airflow or the minimum spacing around a circuit board on its host system.

Typically, the known methods for increasing memory module capacity raise thermal management issues. What is needed, therefore, are methods and structures for providing high capacity circuit boards in thermally efficient, reliable designs that perform well at higher frequencies but are not too large, yet can be made at reasonable cost with commonly available and readily managed materials.

SUMMARY

A flexible circuit is populated on one or both sides and disposed about a substrate to create a circuit module. Along one of its edges, the flex circuit is connected to a connective facility such as a multiple pin connector while the flex circuit is disposed about a thermally-conductive form that provides structure to create a module with plural layers of circuitry in a single module. In preferred embodiments, the form is metallic and thermally conductive and, in alternative preferred embodiments, the module circuitry is disposed within a housing. Preferred embodiments may be devised that present a compact flash module within a housing that may be connected to or into a system or product through a connective facility that is preferably a male or female socket connector while the enclosure may be configured for mechanical adaptation to an application environment.

DETAILED DESCRIPTION OF PREFERRED EMBODIMENTS

Figure 1:
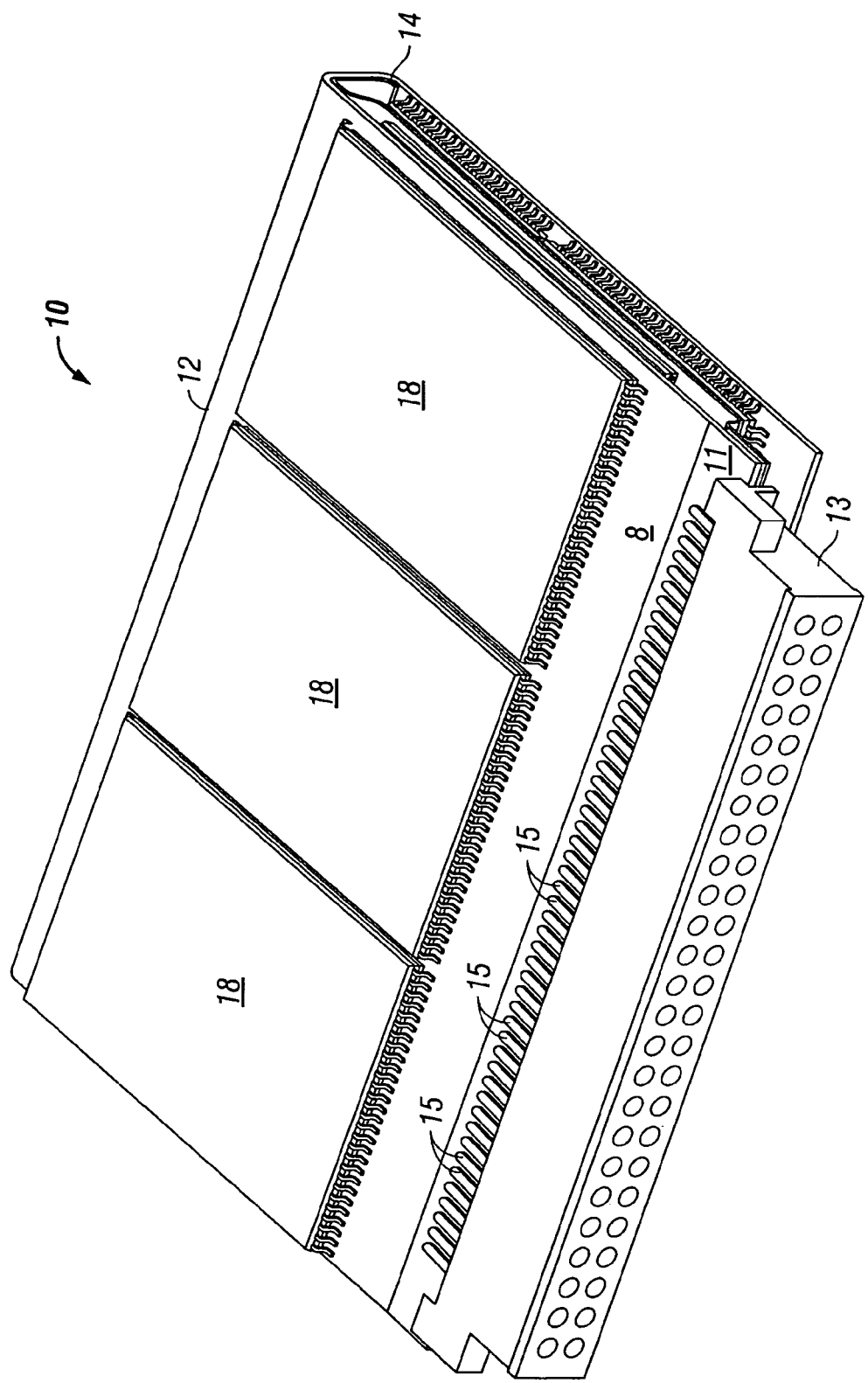
FIG. 1 depicts a perspective view of a module devised in accordance with a preferred embodiment of the present invention.

FIG. 1 is a perspective view of a module 10 devised in accordance with an embodiment of the present invention. Preferred module 10 includes a flex circuit 12 populated with memory ICs 18 and adjunct IC 19 as further depicted in FIG. 2. Flex circuit 12 is disposed about a metallic substrate 14 that provides a form for the module. Preferably substrate 14 is aluminum but other metallic materials may be thermally superior but more costly such as, for example, copper. Flex circuit 12 is preferably made from conductive layers supported by one or more flexible substrate layers as further described with reference to later Figs. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces.

ICs 18 on flexible circuit 12 may be leaded, CSP or bare die. In the embodiment of FIG. 1, leaded packaged flash memory devices are represented as ICs 18. Other types of memory devices may be aggregated according to the invention but preferred modules are devised for aggregation of flash memory. Typically, flash memory is currently packaged in leaded packages but as chip-scale packaging ("CSP") of flash memory circuitry arises, the invention may be adapted for use with such CSP packaged devices. For purposes of this disclosure, the term "leaded" shall refer to packaged circuits devices that exhibit connection between one or more integrated circuits within a plastic, metal or ceramic or hermetic casing and an environment through leads emergent from one or more peripheral sides of what is typically a rectangular package. Most often such packages exhibit plastic casings as is known in the art. A variety of devices come in leaded packages and the invention is not limited to only aggregation of memory or flash memory devices.

The term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices. Although CSP excludes leaded devices, references to CSP are to be broadly construed to include the large variety of array devices (and not to be limited to memory only) and whether die-sized or other size such as BGA and micro BGA as well as flip-chip. Embodiments of the present invention may be employed with leaded or CSP devices or other devices in both packaged and unpackaged forms but leaded flash memory devices are a preferred memory circuitry aggregated through the invention as depicted in a preferred embodiment shown in FIG. 1.

Multiple integrated circuit die may be included in a package depicted a single IC 18. While in this embodiment memory ICs are used to provide a memory expansion, this is not limiting and various embodiments may include a variety of integrated circuits and other components. Such variety may include microprocessors, FPGA's, RF transceiver circuitry, digital logic, as a list of non-limiting examples, or other circuits or systems which may benefit from a high-density module capability. Circuitry 19 shown in FIG. 2 for example may be a buffer or control circuitry as is known in the art.

FIG. 1 depicts a top or outer side 8 of flex circuit 12 having three leaded ICs 18. Other embodiments may have other numbers of devices mounted on side 8 of flex circuit 12. Contacts such as, for example, pads, are disposed beneath ICs 18 and later shown circuit 19 to provide conductive paths for interconnection to the ICs mounted along flex circuit 12 as appreciated by those of skill in the art. Flex circuit 12 of the embodiment shown in FIG. 1 exhibits a contact area 11 where a plurality of contacts are presented to allow connection of the flex circuit and, by extension, those ICs mounted along flex circuit 12, to a connective facility 13 that presents an interface through which the integrated circuitry along the flex circuit may be electrically accessed. An exemplar connective facility is typified by the illustrated female fifty-pin connector. Connector 13 exhibits pins 15 for connection to the contacts of flex circuit 12. Other connective facilities 13 may exhibit differing techniques for connection to flex circuit 12 but those of skill will in the art will be able to readily accommodate such alternative connection strategies with little or no experimentation.

Flex circuit 12 is wrapped about substrate 14 to place ICs 18 that are populated along side 8 of flex circuit 12 on the outside of module 10 while those ICs that are populated along side 9 of flex circuit 12 (shown in FIG. 2B) are disposed on the inside of exemplar module 10. Substrate 14 is preferably comprised of metallic material to exhibit advantageous thermal characteristics. As shown in this and later Figs., substrate 14 is preferably a planar-like member having first and second major sides proximal to which ICs along side 9 of flex circuit 12 of module 10 may be disposed when flex circuit 12 is wrapped about substrate 14.

Figure 2A:
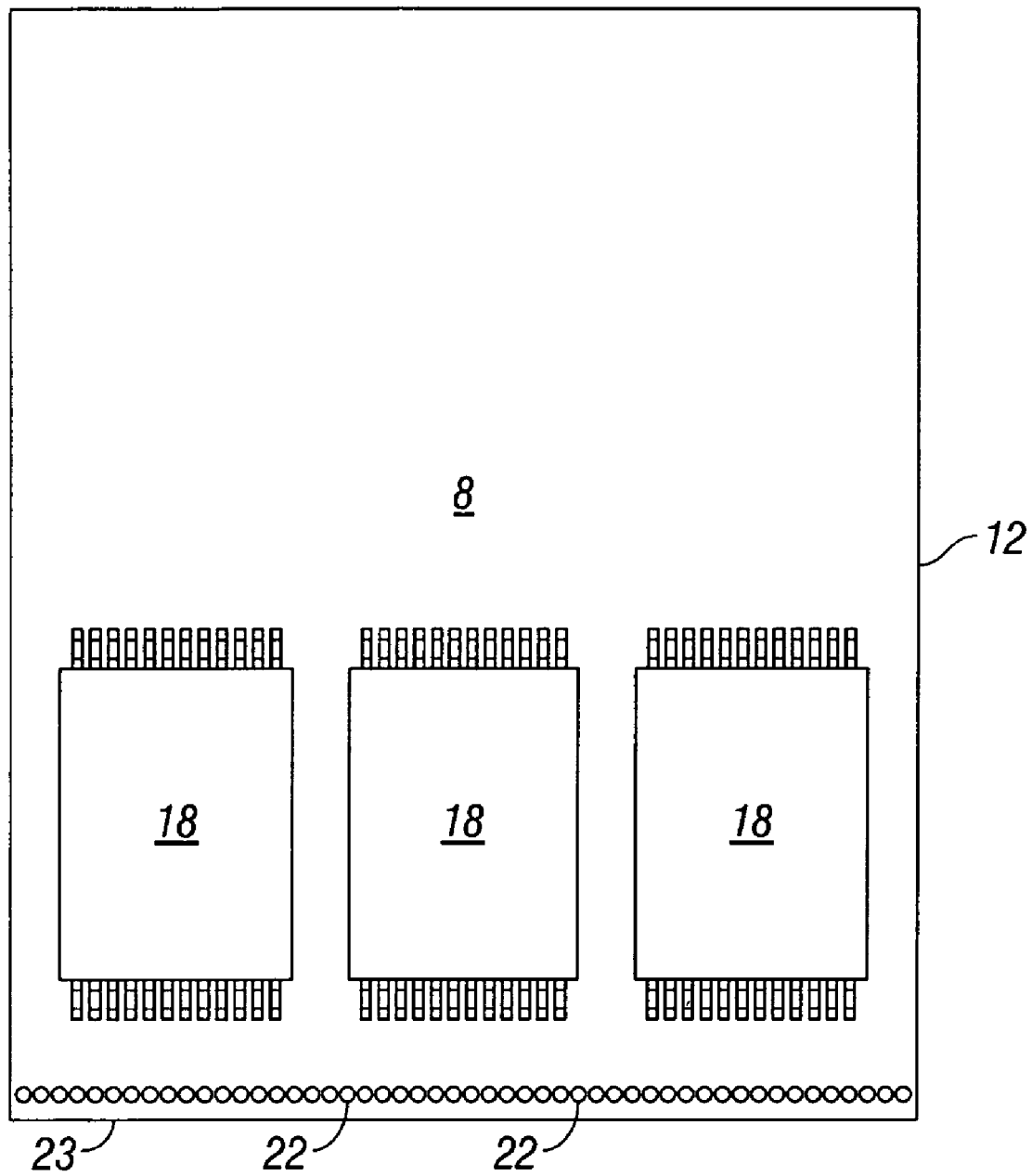
FIG. 2A depicts one side of a flex circuit employed in a module devised in accordance with a preferred embodiment of the present invention.

FIG. 2A illustrates a side of a flex circuit employed in an exemplar module 10. As shown, flex circuit 12 has three leaded ICs 18 mounted along a first half of side 8 and exhibits a plurality of contacts 22 proximal to flex edge 23 for connection of flex circuit 12 to a connective facility such as a connector as later shown.

Figure 2B:
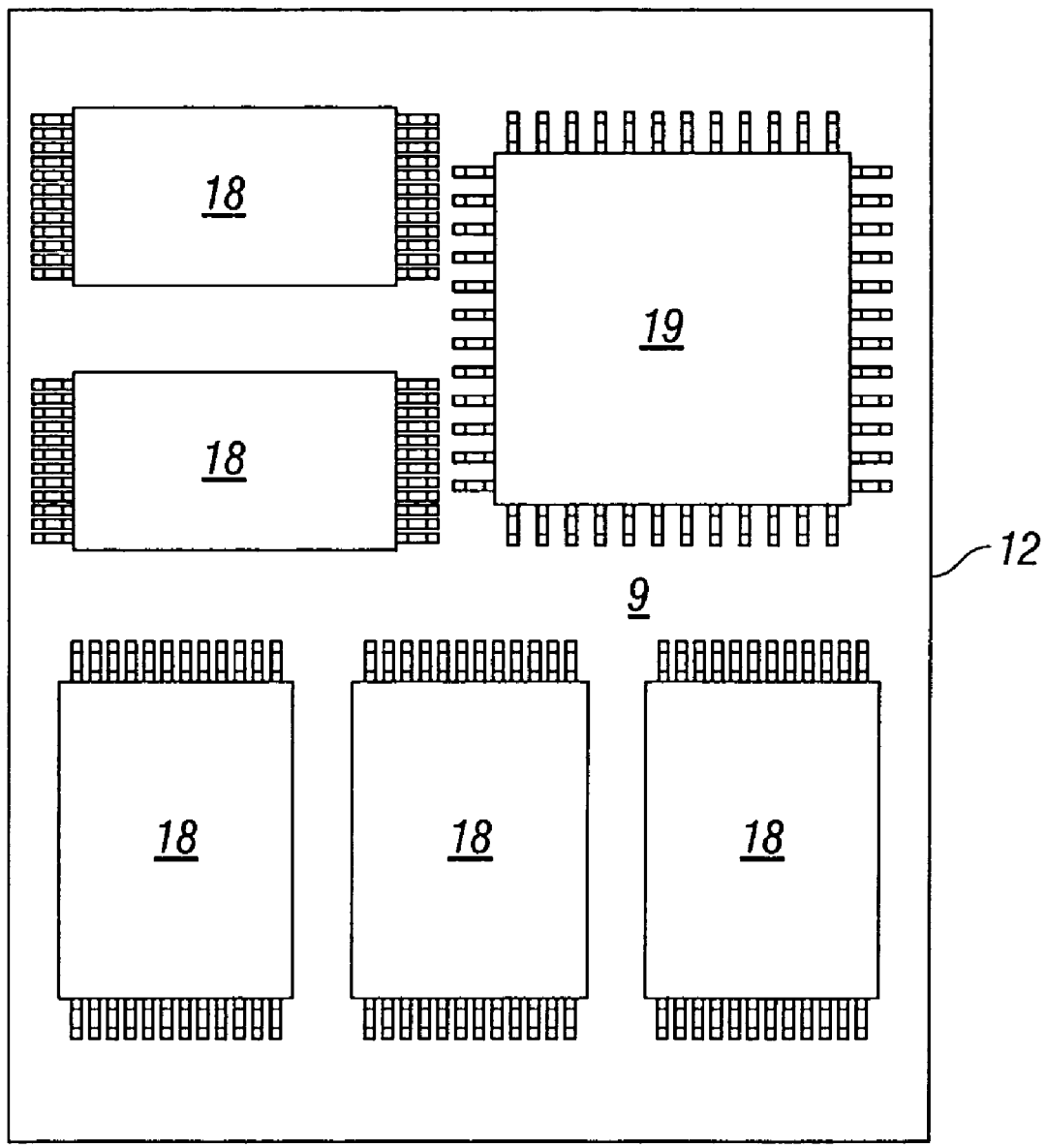
FIG. 2B depicts another side of a flex circuit employed in a module devised in accordance with a preferred embodiment of the present invention.

FIG. 2B illustrates another side 9 of flex circuit 12 as may be employed in a preferred embodiment of the present invention. In a typical preferred embodiment, side 9 becomes an inner side of flex circuit 12 with respect to module 10 and side 8 of flex circuit 12. As shown, five ICs 18 are populated along side 9 of flex circuit 12 along with adjunct circuit 19 which may be a control or buffer circuitry, for example. As shown in earlier FIG. 1, three ICs are disposed along side 8 of flex circuit 12 and thus, module 10 in the depicted embodiment exhibits eight leaded ICs 18. Those of skill will recognize that other numbers of ICs 18 may be aggregated in embodiments of the invention and the invention in adaptable to ICs that are leaded or are CSPs.

Figure 3:
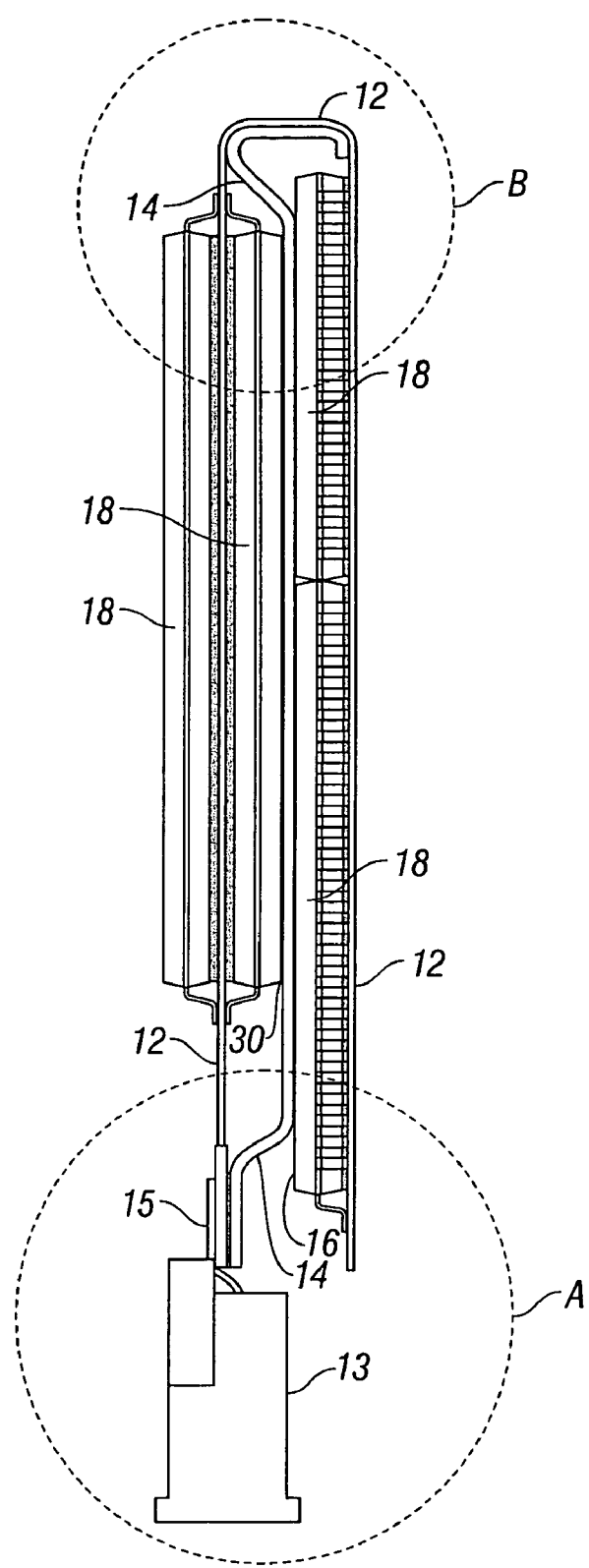
FIG. 3 depicts a cross-section view of a module devised in accordance with a preferred embodiment of the present invention.

FIG. 3 is a cross-sectional depiction of a module 10 devised in accordance with a preferred embodiment of the present invention. Substrate 14 is shown in cross-section and flex circuit 12 is depicted disposed about substrate 14 to place upper sides 16 of ICs 18 disposed along inner side 9 of flex circuit 12 adjacent to substrate 14. Adhesive 30 may be employed to secure ICs 18 to substrate 14 and thermally conductive adhesives are preferred. Pins 15 are shown connected along outer side 8 of flex circuit 12 to contacts 22 (not visible in FIG. 3) while substrate 14 is attached to side 9 of flex circuit 12 proximal to connector 13 as shown in this embodiment. Other arrangements may dispose substrate 14 differently such as, for example, fixing substrate 14 with connective facility 13 by inserting substrate 14 into connective facility 13. Substrate 14 may be devised in a variety of configurations and materials to provide, for example, an appropriate radius for the flex to transit about the substrate or wells into which module ICs may be disposed.

Figure 4:
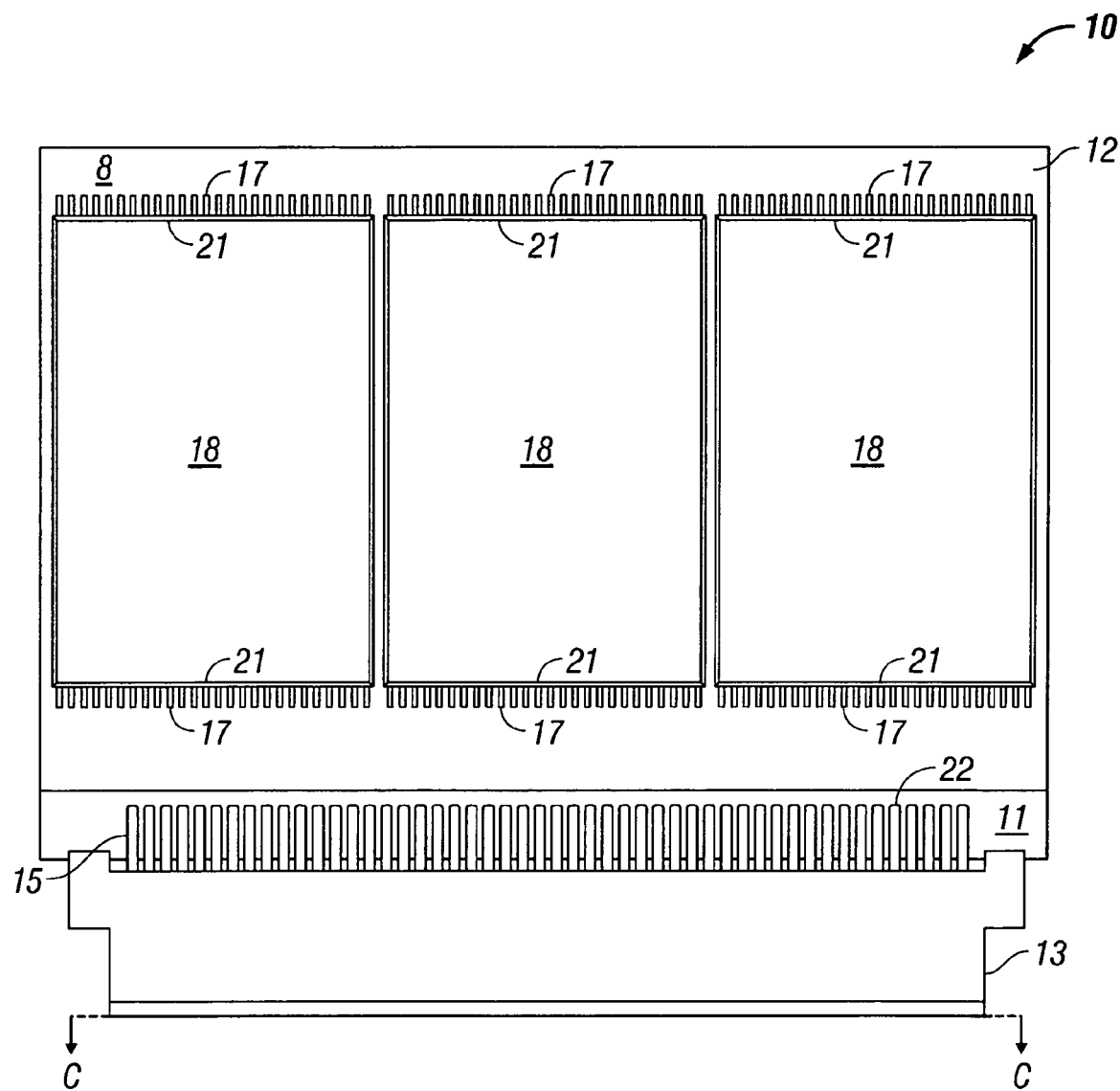
FIG. 4 depicts a plan view of a module in accord with an embodiment of the invention.

FIG. 4 depicts a plan view of a module 10 devised in accordance with a preferred embodiment of the present invention. Illustrated module 10 exhibits three flash memory leaded package ICs 18 disposed along side 8 of flex circuit 12. Those of skill will recognize that the present invention will be advantageous in aggregating fewer or more ICs 18 than the eight depicted in the earlier Figs. ICs 18 exhibit leads 17 emergent from peripheral sides 21 of ICs 18. Pins 15 of connector 13 are soldered in the depicted preferred embodiment to pads 22 of connective area 11 of flex circuit 12.

Figure 5:
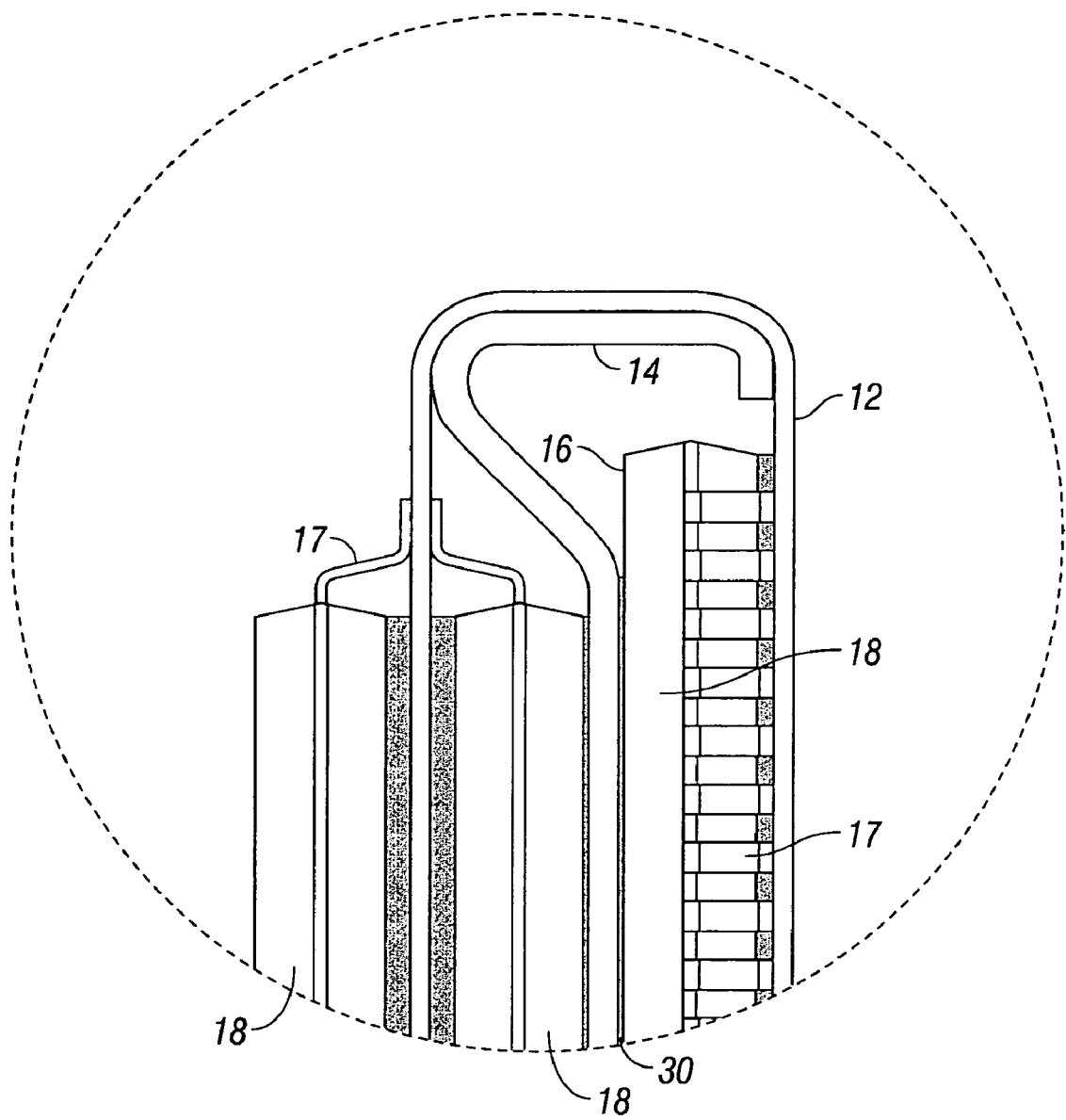
FIG. 5 is an enlarged depiction of the area marked "B" in FIG. 3.

FIG. 5 depicts an enlarged view of the area marked with "B" in FIG. 3. Shown are ICs 18 mounted along flex circuit 12 with two of the ICs 18 that are mounted along inner side 9 of flex circuit 12 being shown with their respective upper sides 16 in proximity to substrate 14 which exhibits transit 14A to allow preferred multi-layer flex circuit 12 to transit about the substrate in the depicted preferred embodiment.

Figure 6:
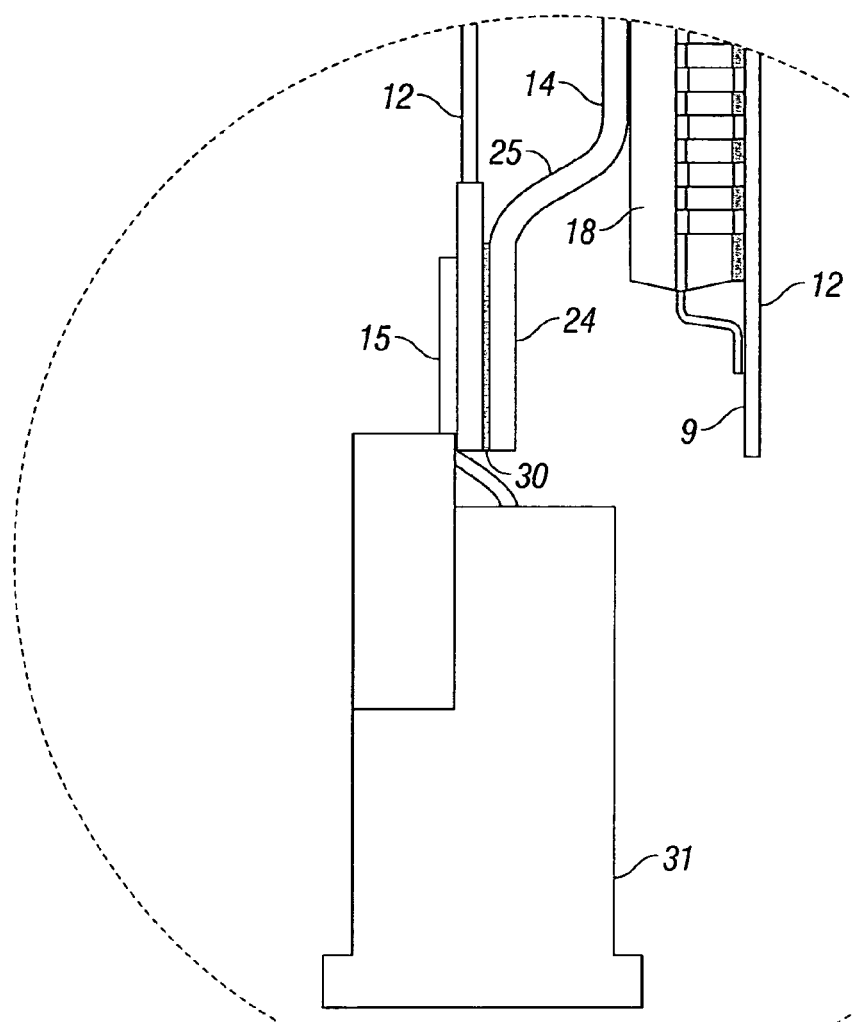
FIG. 6 is an enlarged depiction of the area marked "A" in FIG. 3.

FIG. 6 is an enlarged view of a portion of module 10 identified by "A" in FIG. 3. Connector 31 is shown with solder pins 15 attached to flex circuit 12 while substrate 14 is attached to flex circuit 12 with adhesive 30. Major sides 24 and 25 of substrate 14 are identified in this enlarged view. IC 18 populated along side 9 of flex circuit 12 is shown disposed proximal to one of the two major sides of substrate 14. Depicted IC 18 may either contact substrate 14 along parts or all of its upper surface 16 or it may be located proximal to substrate 14 but distanced from it by adhesive which in preferred embodiments is a thermally conductive adhesive.

Figure 7:
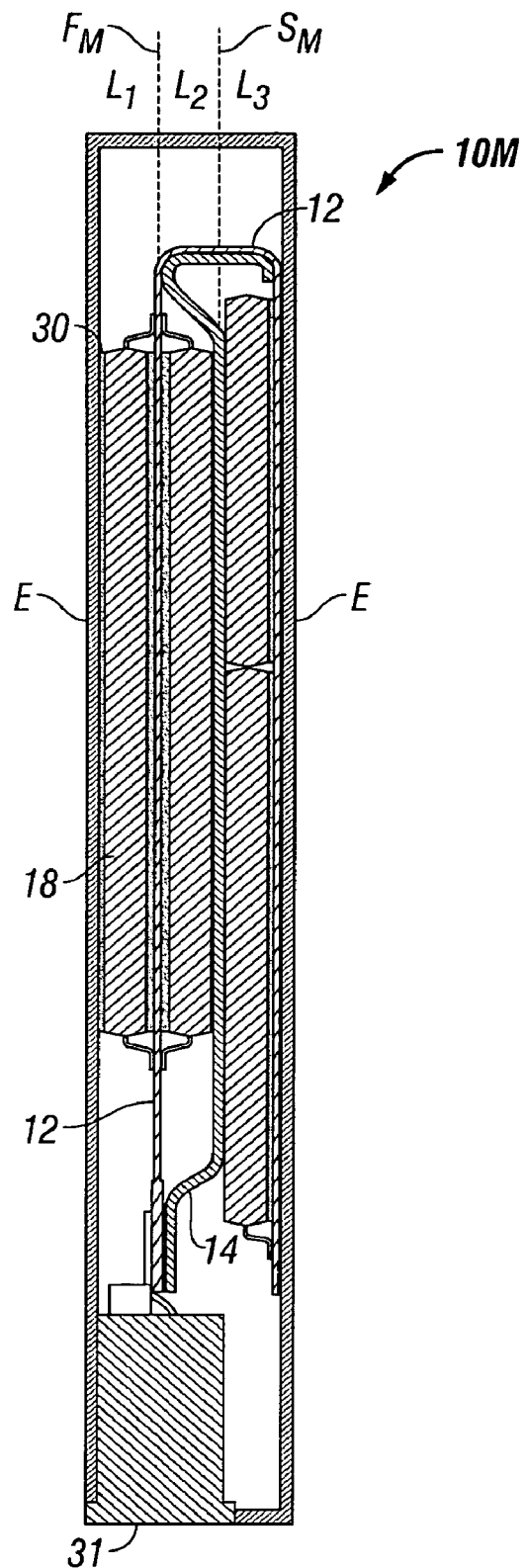
FIG. 7 is a cross-sectional view of a module and associated enclosure in accord with the invention.

FIG. 7 is a cross-sectional view of a module 10M disposed in enclosure "E" to present a compact flash module for connection to an environment through exemplar 50 pin connector 31. Enclosure E may be comprised of a variety of materials such as, for example, high impact resistant plastics being just one of many preferred variations that those of skill will be able to select in accordance with this invention and the relevant operating environment and manufacturing and cost constraints. Upper surface 16 of an IC 18 may be attached to enclosure E with adhesive 30 as represented in FIG. 7. A portion of surface 8 of flex circuit 12 may also be affixed to enclosure E to provide a more integrated enclosed module.

FIG. 7 portrays a medial line SM depicting a plane through substrate 14 and a medial line $F_M$ demarking a plane through flex circuit 12 on one side of substrate 14. Three layers of ICs are identified by references L1, L2, and L3. As shown, two layers of ICs which comprise, in the exemplar module 10M depicted in FIG. 7, two layers of flash memory are depicted on one side of substrate 14 while a third layer of ICs are shown on the other side of substrate 14. Consequently, in the depicted module, three layers of memory are shown aggregated in exemplar module 10M.

Figure 8:
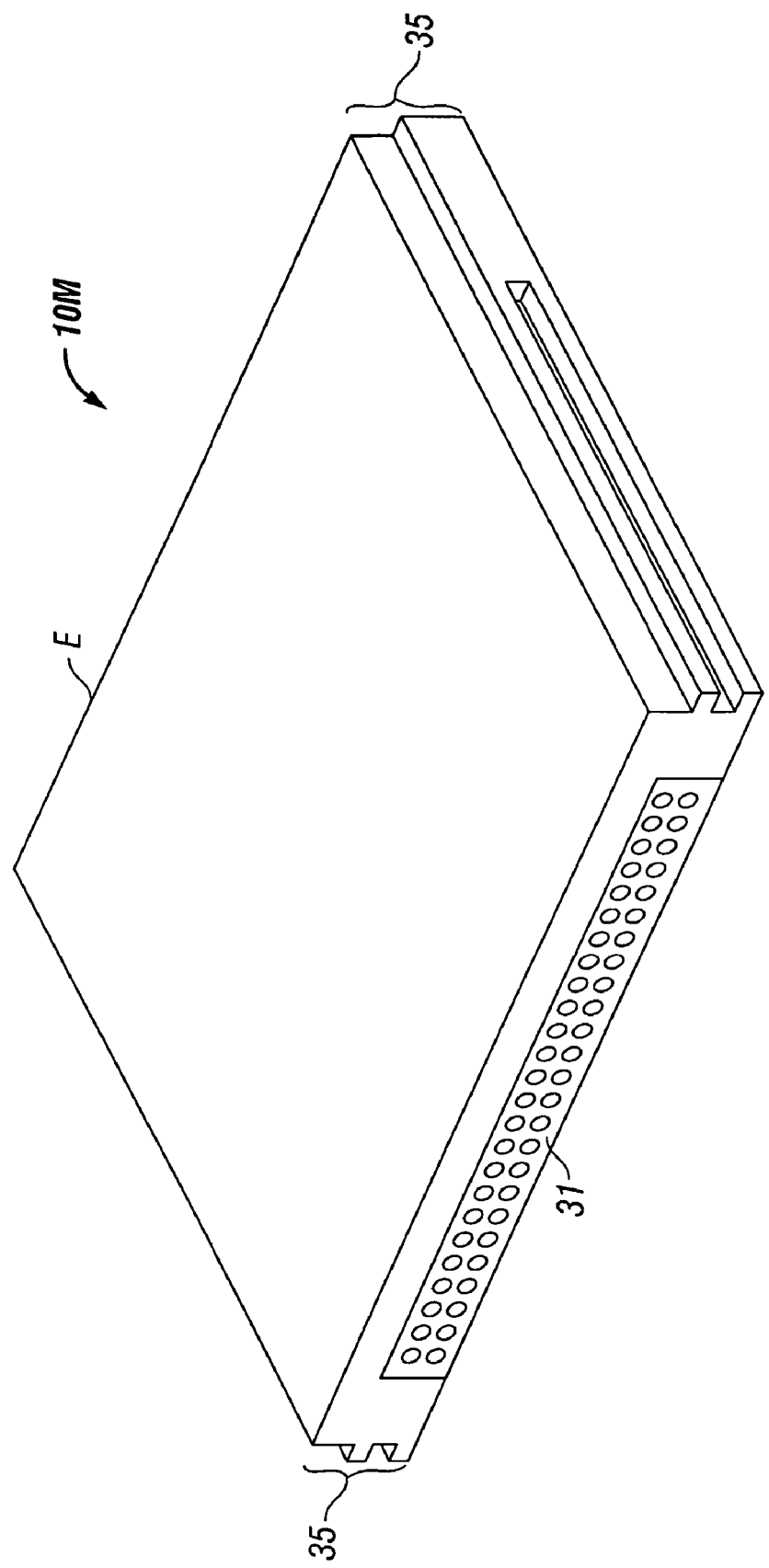
FIG. 8 is a perspective view of the enclosed module of FIG. 7.

FIG. 8 depicts a perspective view of a preferred compact flash module 10M in accordance with the present invention that is devised to provide flash memory capability for a variety of systems and products. The particular preferred embodiment shown in FIG. 8 is configured with mounting structures 35 to provide ready mating with application structures to affix module 10M to the environment while electrical communication between the environment and module 10M is provided through connector 31.

Figure 9:
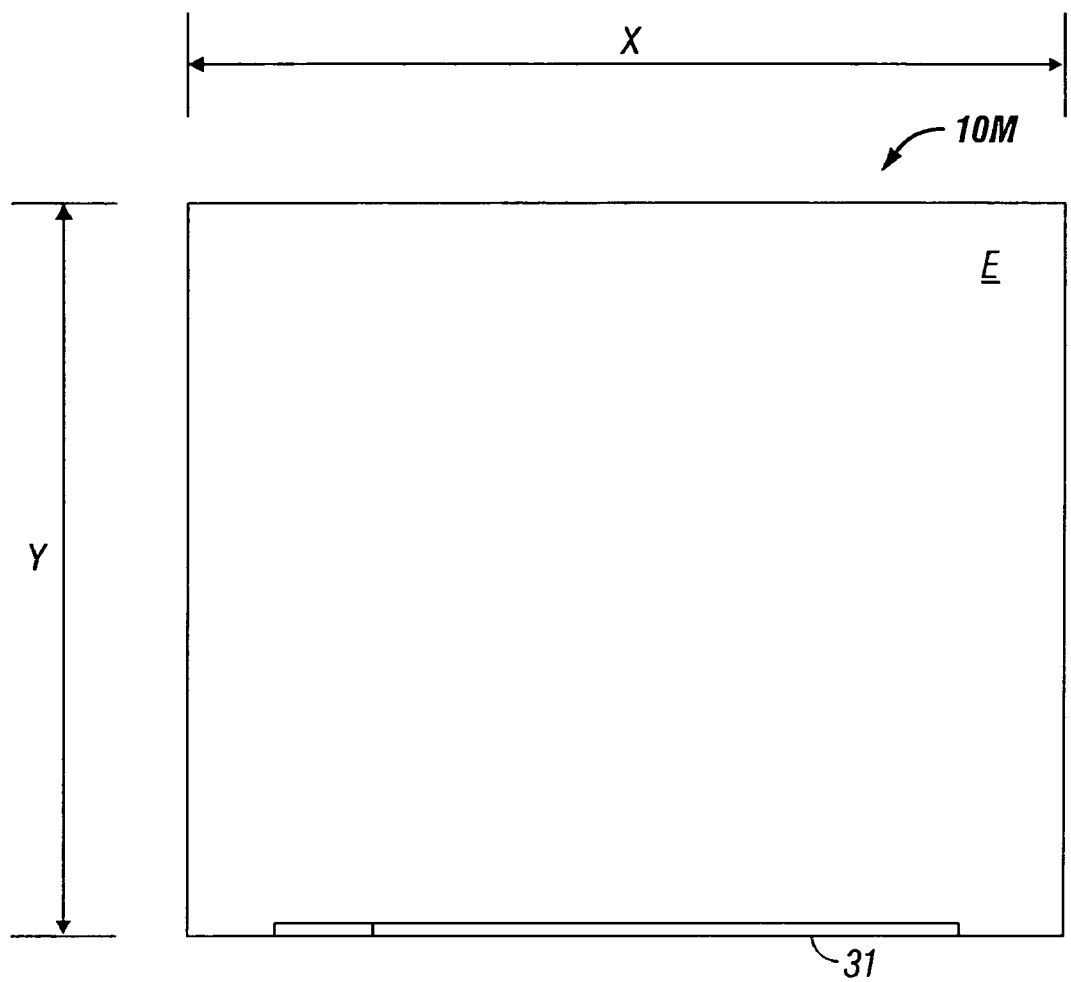
FIG. 9 is a plan view of an enclosure within which is a module in accord with the present invention.

FIG. 9 depicts an exemplar module 10M with enclosure E and connector 31 for connection to the ICs 18 and, typically, IC 19 within enclosure E. The depiction of FIG. 9 illustrates the dimensions of a typical module 10M that provides flash memory storage with eight flash memory ICs 18 as earlier depicted. Dimension X is approximately 42 mm. and dimension Y is approximately 36 mm. although those of skill will appreciate that these dimensions are arbitrary and modules 10M in accordance with the present invention may be devised that illustrate a large variety of dimensions and that enclosure E may, for example, be configured in a variety of configurations to make module 10M mechanically adaptable to a multiplicity of applications.

Figure 10:
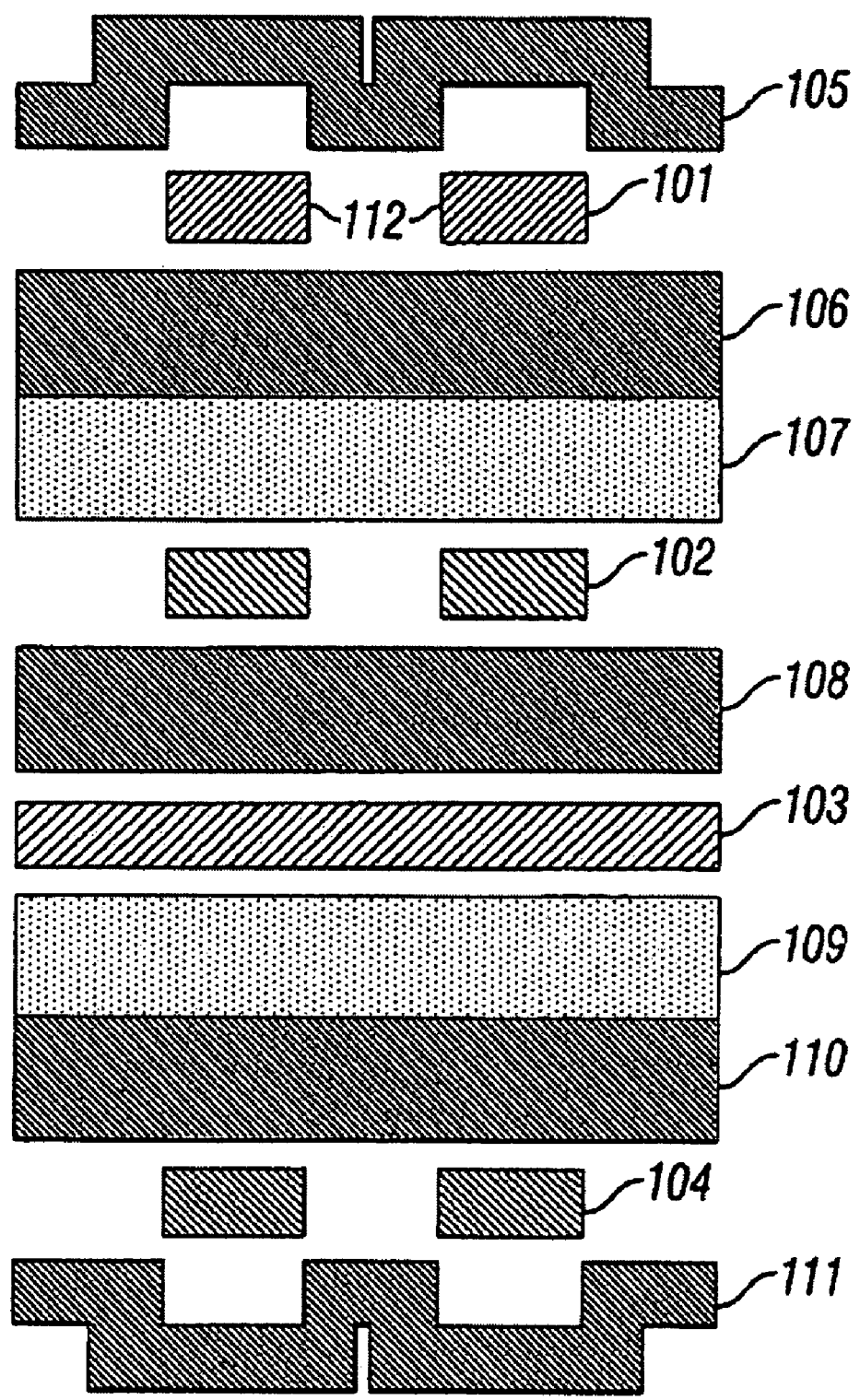
FIG. 10 depicts a cross-sectional view of a flex circuit in accord with the present invention.

FIG. 10 is an exploded depiction of a flex circuit 12 cross-section according to one embodiment of the present invention. The depicted preferred flex circuit 12 has four conductive layers 101-104 and seven insulative layers 105-111. The numbers of layers described are merely those of one preferred embodiment, and other numbers and layer arrangements may be used.

Top conductive layer 101 and the other conductive layers are preferably made of a conductive metal such as, for example, copper or copper alloy. In this arrangement, conductive layers 101, 102, and 104 express signal traces 112 that make various connections on flex circuit 12. These layers may also express conductive planes for ground, power, or reference voltage. For example, top conductive layer 101 may also be provided with a flood, or plane, of to provide the VDD to ICs mounted to flex circuit 12.

In this embodiment, inner conductive layer 102 expresses traces connecting to and among the various devices mounted along the sides of flex circuit 12. The function of any of the depicted conductive layers may, of course, be interchanged with others of the conductive layers. Inner conductive layer 103 expresses a ground plane, which may be split to provide VDD return for pre-register address signals. Inner conductive layer 103 may further express other planes and traces. In this embodiment, floods, or planes, at bottom conductive layer 104 provides VREF and ground in addition to the depicted traces.

Insulative layers 105 and 111 are, in this embodiment, dielectric solder mask layers which may be deposited on the adjacent conductive layers. Insulative layers 107 and 109 are made of adhesive dielectric. Other embodiments may not have such adhesive dielectric layers. Insulative layers 106, 108, and 110 are preferably flexible dielectric substrate layers made of polyamide. Any other suitable flexible circuit substrate material may be used.

Although the present invention has been described in detail, it will be apparent to those skilled in the art that many embodiments taking a variety of specific forms and reflecting changes, substitutions and alterations can be made without departing from the spirit and scope of the invention. The described embodiments illustrate the scope of the claims but do not restrict the scope of the claims.

The invention claimed is:

1. A circuit module comprising:
   a multilayer flex circuit have first and second sides, the first side being populated with first and second sets of integrated circuits, the second side being populated with a third set of integrated circuits disposed diametrically opposite the first set of integrated circuits;
   a rigid planar substrate, the multilayer flex circuit being folded between the first and second sets of integrated circuits and set about said rigid planar substrate so as to dispose said first and second sets of integrated circuits adjacent to and separated from each other by said rigid planar substrate with the rigid planar substrate being substantially coincident with a first medial plane, a plane separating the first and the second set of integrated circuits, and a part of the multilayer flex circuit separating the third set of integrated circuits from the first set of memory integrated circuits being substantially coincident with a second medial plane, a plane separating the first and the third set of integrated circuits, which is parallel to said first medial plane, three layers of integrated circuits therefore being exhibited which three layers are comprised from said first, second and third sets of integrated circuits to form an assembly which is electrically connected to a connector and fitted into an open-ended enclosure which is closed by said connector and the assembly being disposed in said enclosure so as to position said second set of integrated circuits and said third set of integrated circuits adjacent the enclosure.

2. The circuit module of claim 1 in which the first set of integrated circuits is comprised of memory.

3. The circuit module of claim 1 in which the second set of integrated circuits is comprised of memory.

4. The circuit module of claim 1 in which the third set of integrated circuits is comprised of memory.

5. The circuit module of claim 1 in which the first set of integrated circuits is comprised of control circuitry.

6. The circuit module of claim 1 in which the second set of integrated circuits is comprised of control circuitry.

7. The circuit module of claim 1 in which the third set of integrated circuits is comprised of control circuitry.

8. The circuit module of claim 1 in which the rigid planar substrate is comprised of metallic material.

9. The circuit module of claim 1 in which the multilayer flex circuit has more than one conductive layer.

10. The circuit module of claim 1 in which the multilayer flex circuit has four metal layers.

11. The circuit module of claim 1 in which the first set of integrated circuits is comprised of buffer circuitry.

12. The circuit module of claim 1 in which the second set of integrated circuits is comprised of buffer circuitry.

13. The circuit module of claim 1 in which the third set of integrated circuits is comprised of buffer circuitry.

* * * * *